(12) United States Patent
McMullan et al.

(10) Patent No.: US 9,184,226 B2
(45) Date of Patent: Nov. 10, 2015

(54) EMBEDDED TUNGSTEN RESISTOR

(75) Inventors: Russell Carlton McMullan, Allen, TX (US); Binu Kamblath Pushkarakshan, Bangalore (IN); Subramanian J. Narayan, Bangalore (IN); Swaminathan Sankaran, Plano, TX (US); Keith Edmund Kunz, Bryan, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 357 days.

(21) Appl. No.: 13/586,672

(22) Filed: Aug. 15, 2012

(65) Prior Publication Data

US 2013/0207221 A1 Aug. 15, 2013

Related U.S. Application Data

(60) Provisional application No. 61/523,575, filed on Aug. 15, 2011.

(51) Int. Cl.
*H01L 27/06* (2006.01)
*H01L 49/02* (2006.01)
*H01L 27/08* (2006.01)

(52) U.S. Cl.
CPC ............ *H01L 28/24* (2013.01); *H01L 27/0629* (2013.01); *H01L 27/0802* (2013.01)

(58) Field of Classification Search
CPC . H01L 27/0802; H01L 27/0629; H01L 28/20; H01L 23/5228; H01L 27/0676; H01L 29/872
See application file for complete search history.

(56) References Cited

U.S. PATENT DOCUMENTS

2006/0118908 A1* 6/2006 Erickson et al. .............. 257/536
2007/0284662 A1* 12/2007 Chinthakindi et al. ....... 257/350

* cited by examiner

*Primary Examiner* — Minh-Loan Tran
*Assistant Examiner* — Leslie Pilar Cruz
(74) *Attorney, Agent, or Firm* — Tuenlap D. Chan; Frank D. Cimino

(57) ABSTRACT

A high TCR tungsten resistor on a reverse biased Schottky diode. A high TCR tungsten resistor on an unsilicided polysilicon platform geometry. A high TCR tungsten resistor between two parallel polysilicon leads on remaining contact etch stop dielectric. A high TCR tungsten resistor embedded in a intermetal dielectric layer above a lower interconnect layer and below an upper interconnect layer. A method of forming a high TCR tungsten resistor on a reverse biased Schottky diode. A method of forming high TCR tungsten resistor on an unsilicided polysilicon platform geometry. A method of forming high TCR tungsten resistor between two parallel polysilicon leads on remaining contact etch stop dielectric. A method of forming high TCR tungsten resistor embedded in a inter metal dielectric layer above a lower interconnect layer and below an upper interconnect layer.

10 Claims, 13 Drawing Sheets

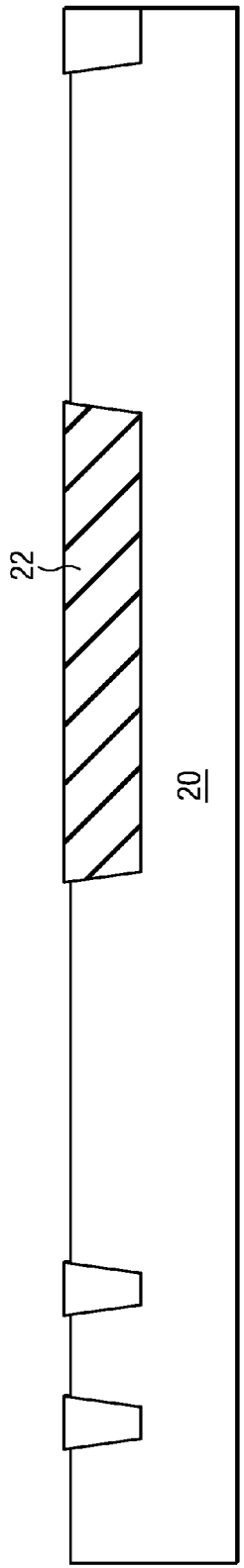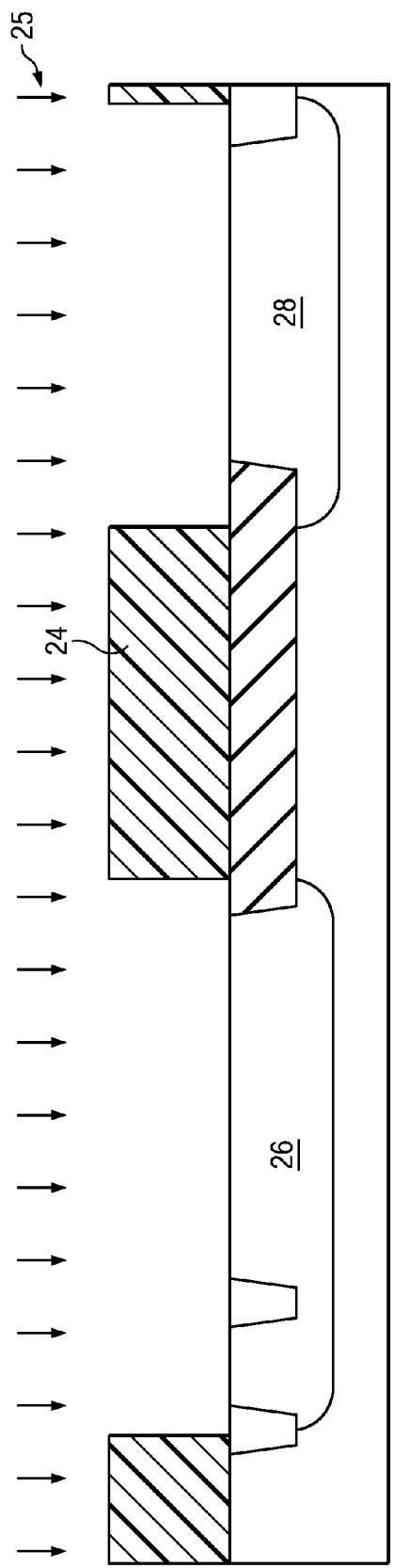

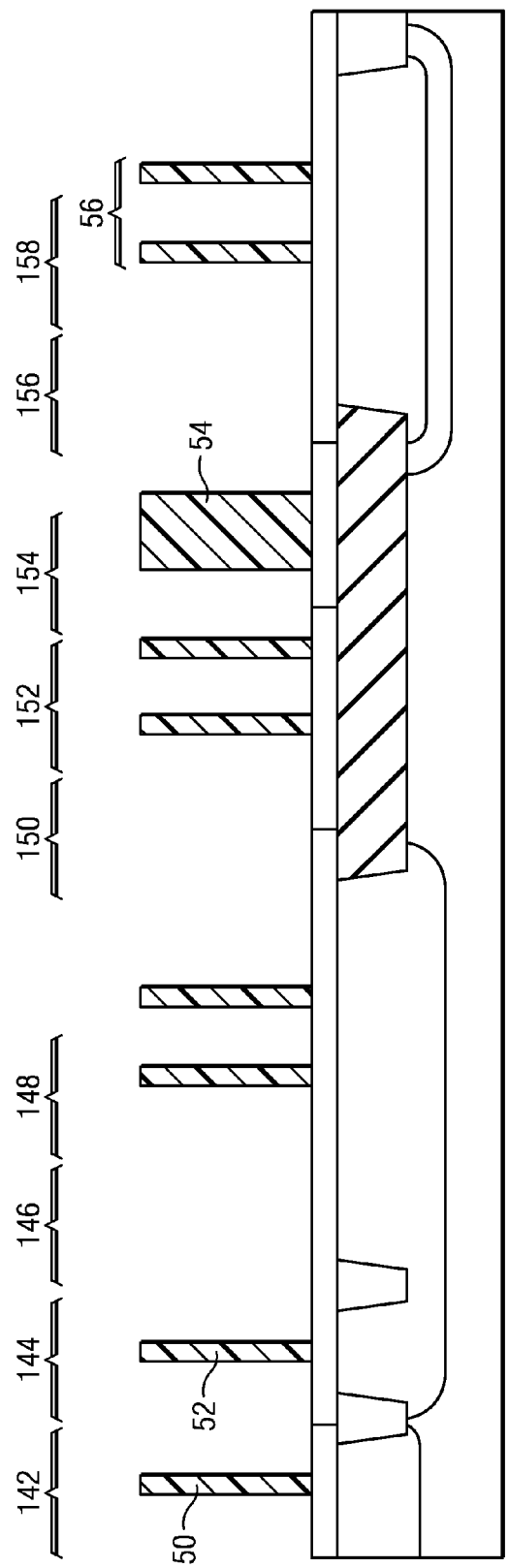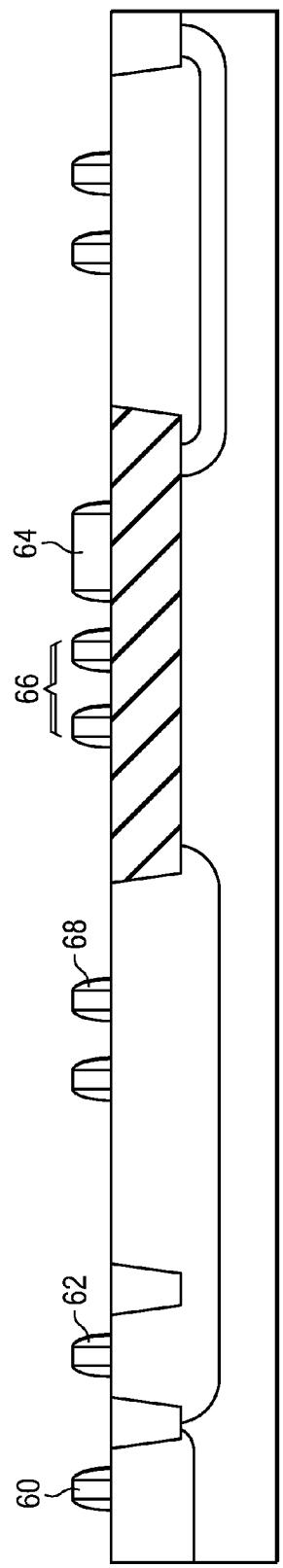

FIG. 1F-B

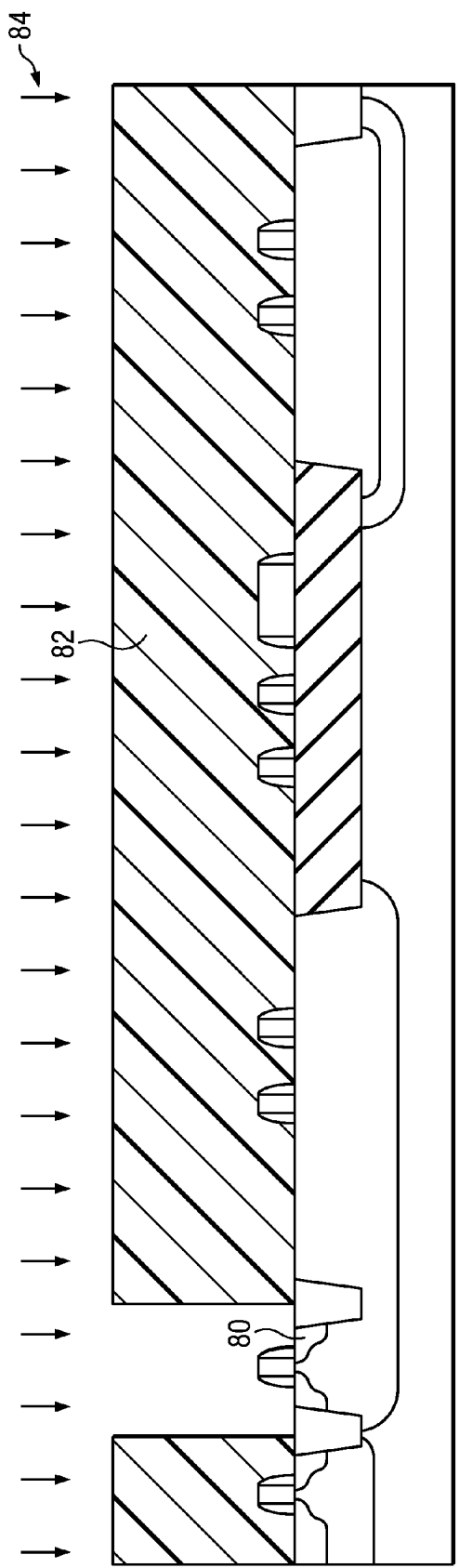
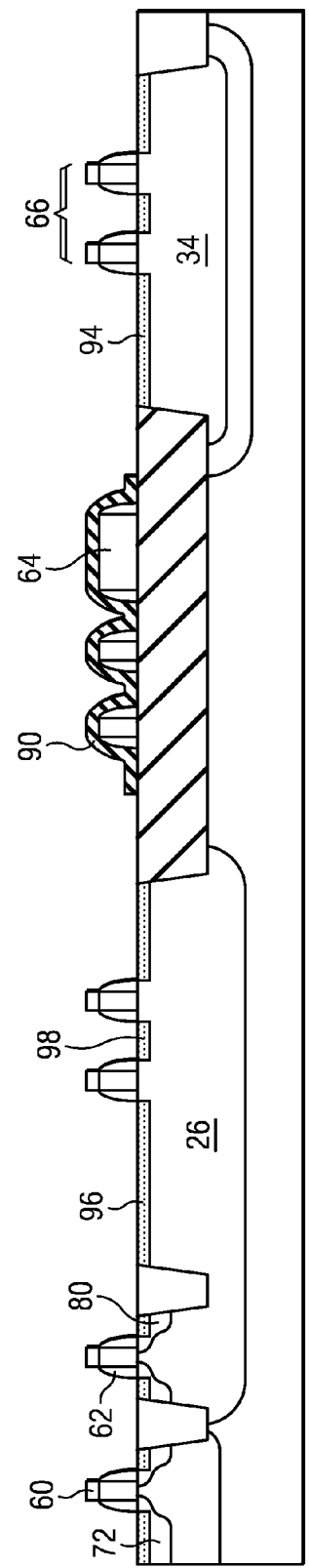
FIG. 1H
FIG. 1I

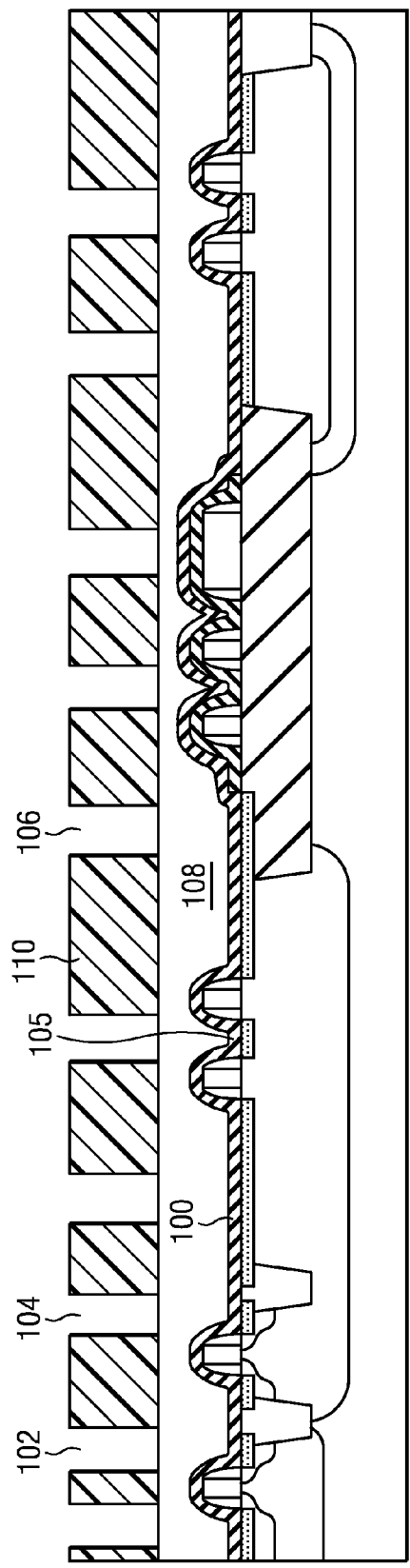
FIG. 1J-A
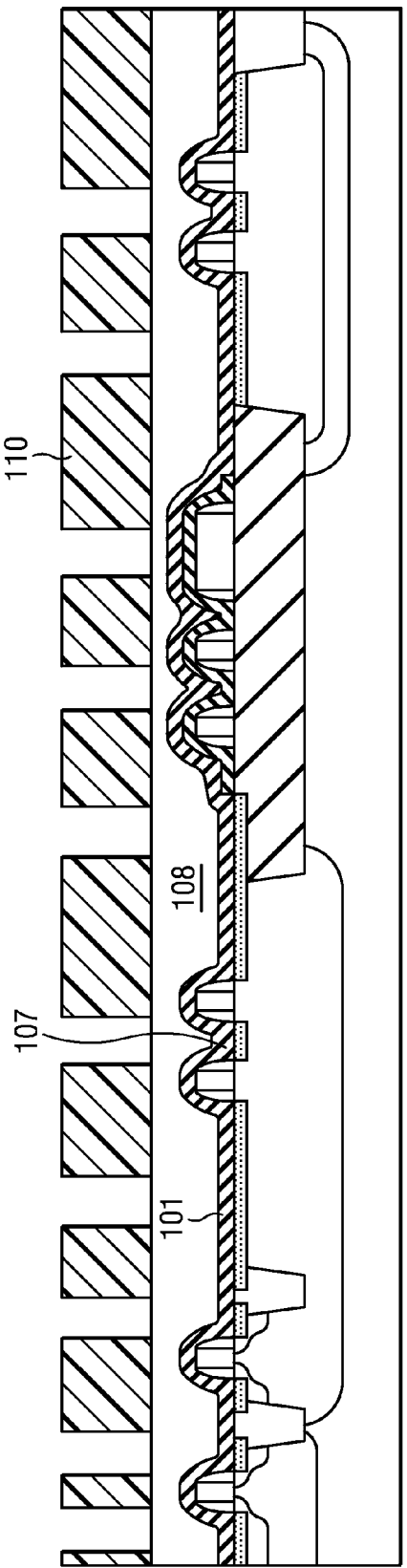
FIG. 1J-B

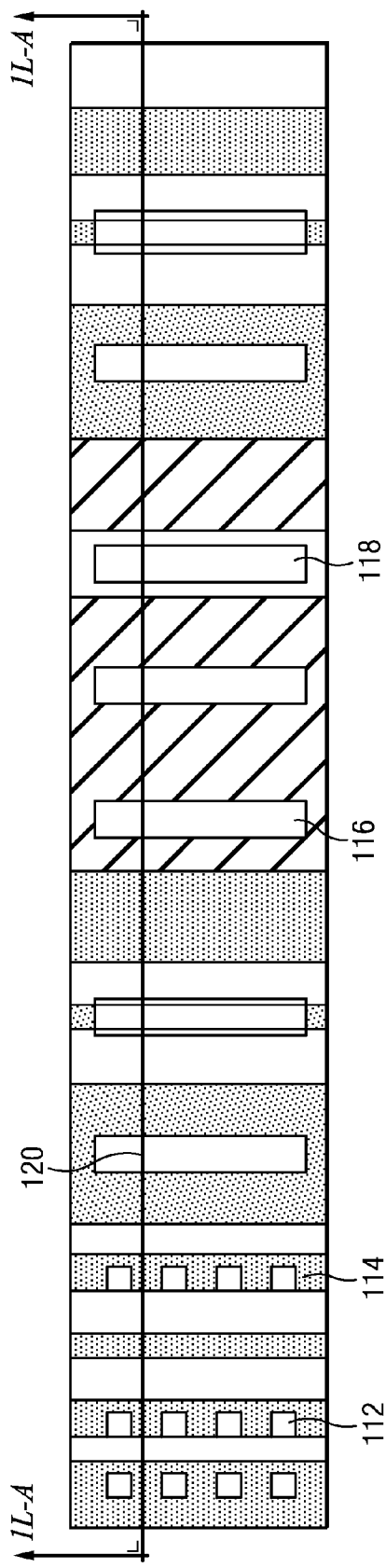
FIG. 1K
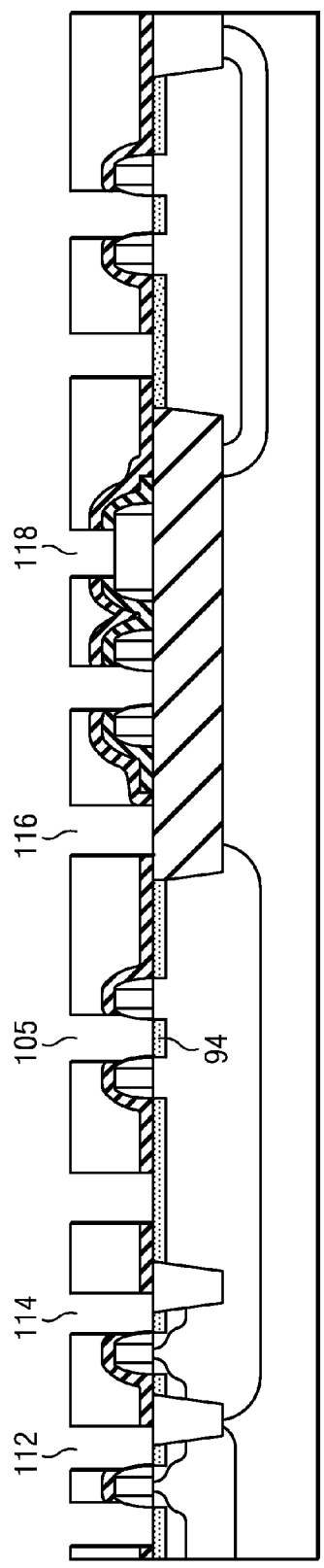
FIG. 1L-A

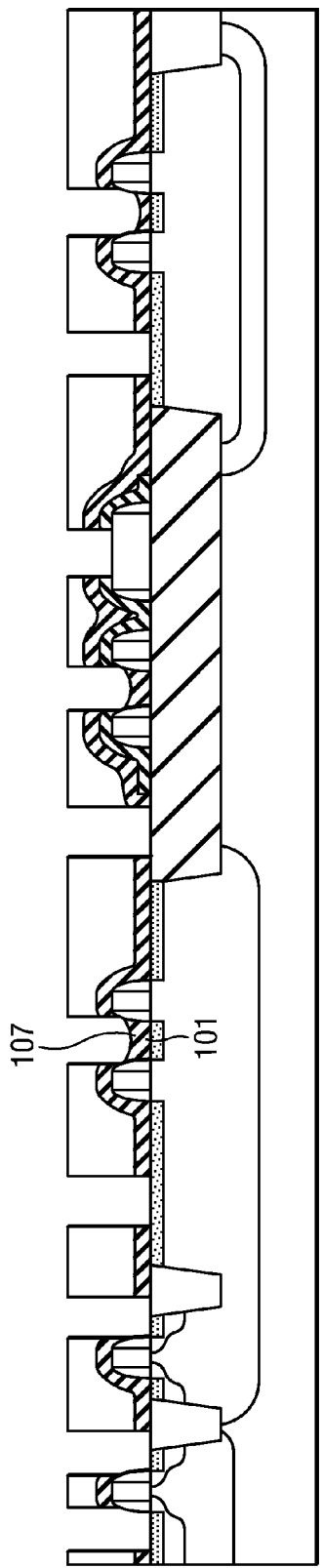
FIG. 1L-B
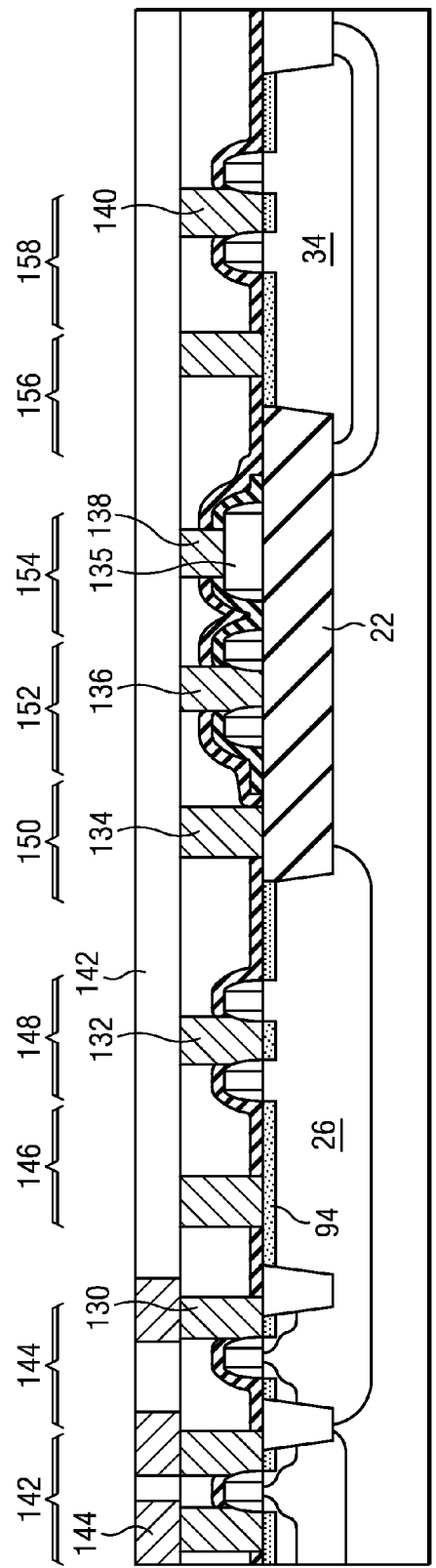
FIG. 1M-A

FIG. 1M-B

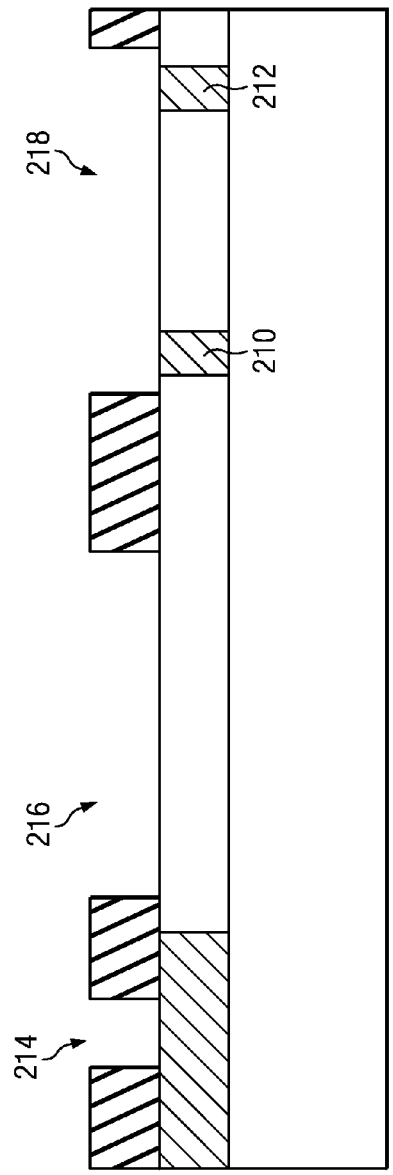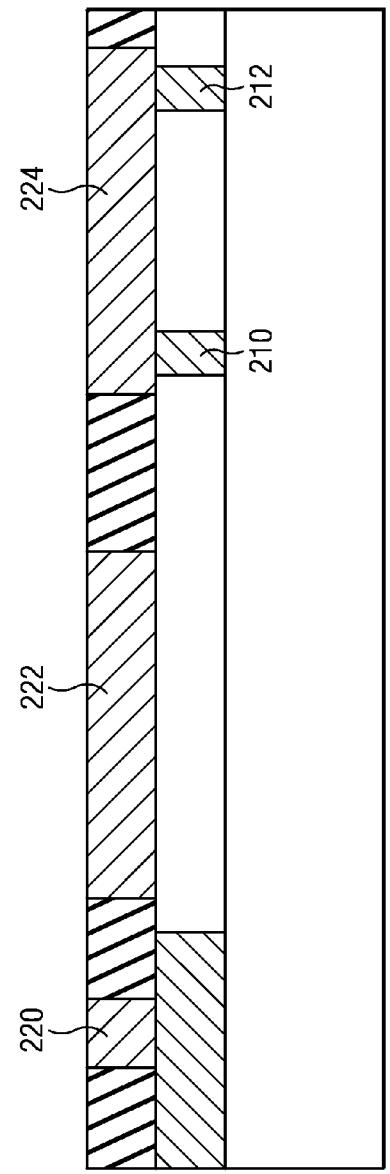

EMBEDDED TUNGSTEN RESISTOR

CROSS-REFERENCE TO RELATED APPLICATIONS

This application claims the benefit of, and incorporates by reference in its entirety, U.S. Provisional Application No. 61/523,575, filed Aug. 15, 2011.

FIELD OF THE INVENTION

This invention relates to the field of integrated circuits. More particularly, this invention relates to forming resistors with a high temperature coefficient of resistance in integrated circuits.

BACKGROUND

In addition to transistors, other devices such as resistors, capacitors and diodes are formed during the manufacture of integrated circuits. These devices may be used to set voltage levels, pass or block signals, and form delay paths. In some cases these devices may be used to measure temperature.

The equation for the resistance of resistor material as a function of temperature is given by the equation $$R_{TEMP} = R_0 + C_1 \Delta T + C_2 (\Delta T)^2$$

Where $R_0$ is the resistance at a reference temperature such as room temperature, $C_1$ is the linear temperature coefficient of resistance, $C_2$ is the quadratic temperature coefficient of resistance, and $\Delta T$ is the difference between ambient temperature and the reference temperature.

Because the resistance of metals commonly used in integrated circuits such as copper and aluminum has low resistance, when a temperature sensing resistor is needed, a high resistance metal such as nickel or molybdenum is added to the integrated circuit process flow to form the temperature sensing resistor. Addition of a new metal to the manufacturing flow adds cost by requiring additional deposition and etching manufacturing steps.

BRIEF DESCRIPTION OF THE DRAWINGS

FIGS. 1A-1M are illustrations of steps in the fabrication of integrated circuits formed according to principles of the invention.

FIGS. 3A-3D are illustrations of steps in the fabrication of integrated circuits formed according to principles of the invention.

DETAILED DESCRIPTION OF EXAMPLE EMBODIMENTS

When a device, such as a resistor, is embedded in an integrated circuit and used to measure temperature, it is desirable to have a large linear change in resistance with temperature, $C_1$, with a low standard deviation and low lot-to-lot variation. It is also desirable for the material to have high resistivity so that less resistor area is needed to develop the required voltage drop.

The equation for resistance of resistor material as a function of temperature is given by the equation $$R_{TEMP} = R_0 + C_1 \Delta T + C_2 (\Delta T)^2$$

Where $R_0 = \rho \ast t / A$ is the resistance at a reference temperature such as room temperature, $C_1$ is the linear temperature coefficient of resistance, $C_2$ is the quadratic temperature coefficient of resistance, and $\Delta T$ is the difference between ambient temperature and the reference temperature. $\rho$ is the resistivity of the material in $\mu\Omega$-cm, t is the thickness of the resistor and A is the cross sectional area of the resistor.

As shown in TABLE 1, metals such as aluminum and copper have a large $C_1$ but low $\rho$.

TABLE 1

| MATERIAL | Element/Alloy | $C_1$ ppm | $\rho$ $\mu\Omega$-cm |
|---|---|---|---|
| Aluminum | Element | 4,308 | 2.7 |
| Constantan | Alloy | 74 | 49 |
| Copper | Element | 4041 | 1.7 |
| Gold | Element | 3715 | 2.4 |
| Iron | Element | 5671 | 9.7 |
| Manganin | Alloy | 15 | 48 |
| Molybdenum | Element | 4579 | 5.6 |
| Nickel | Element | 5866 | 7 |
| Nichrome | Alloy | 17 | 108 |
| Platinum | Element | 3729 | 10.5 |
| Silver | Element | 3819 | 1.6 |
| Steel | Alloy | 3000 | 59 |
| Tungsten | Element | 4403 | 5.6 |
| Zinc | Element | 3847 | 5.9 |

A high TCR resistor specification for deviation from nominal resistance may be +/−100 ppm/° C. for the linear temperature coefficient of resistance and +/−10 ppm/C for the quadratic temperature coefficient of resistance. This high TCR resistor tolerance may enable a temperature sensor accuracy of +/−0.01%/$\Delta$° C.

Figure 1C:
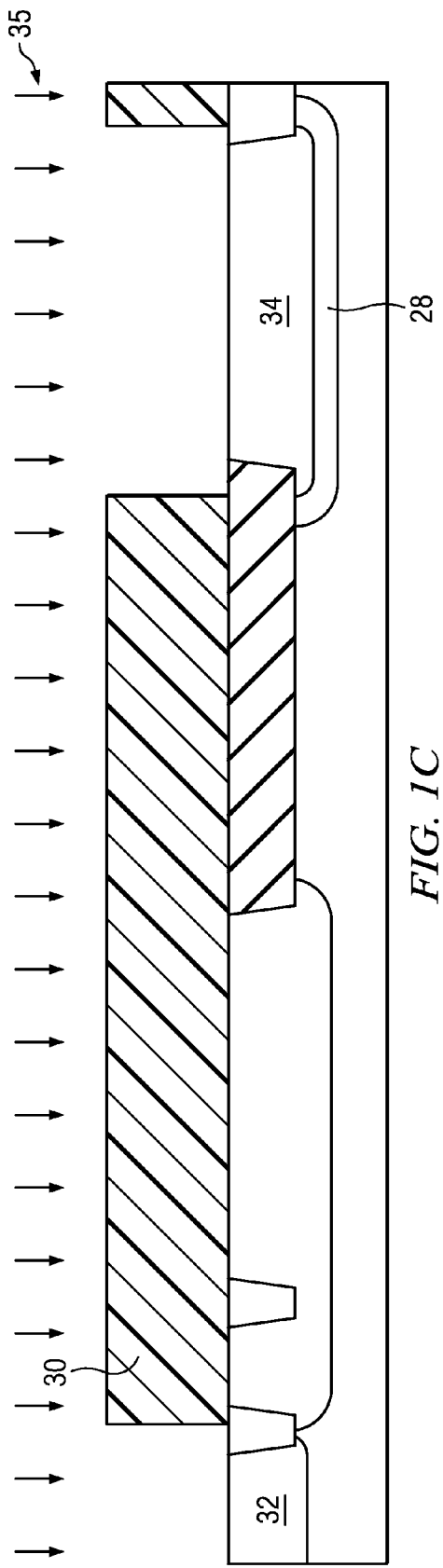
Figure 2A:
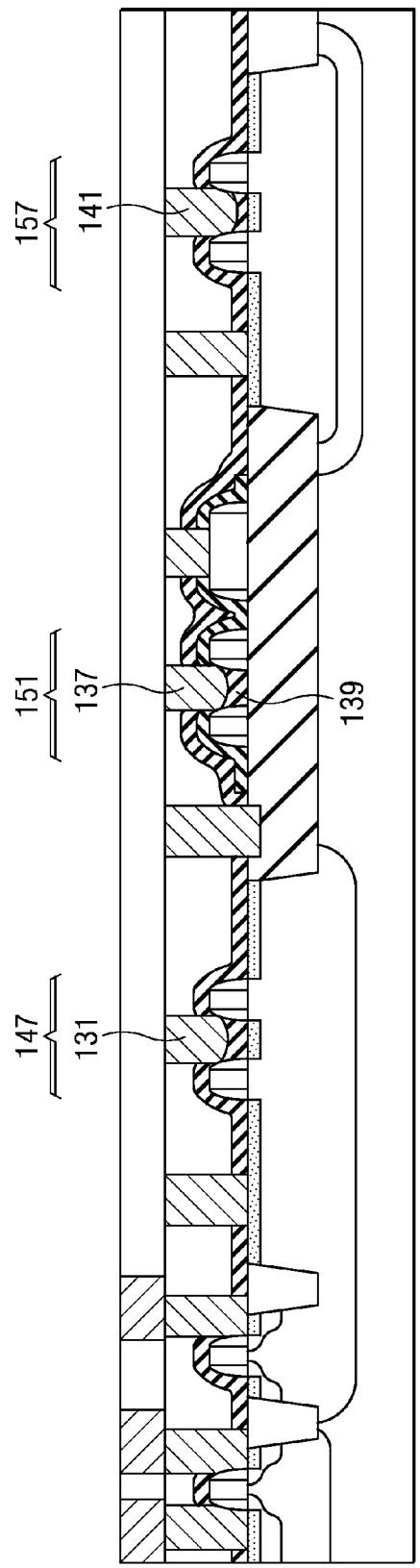
FIGS. 2A and 2B are cross sections of example embodiments of the invention.
Figure 2A:
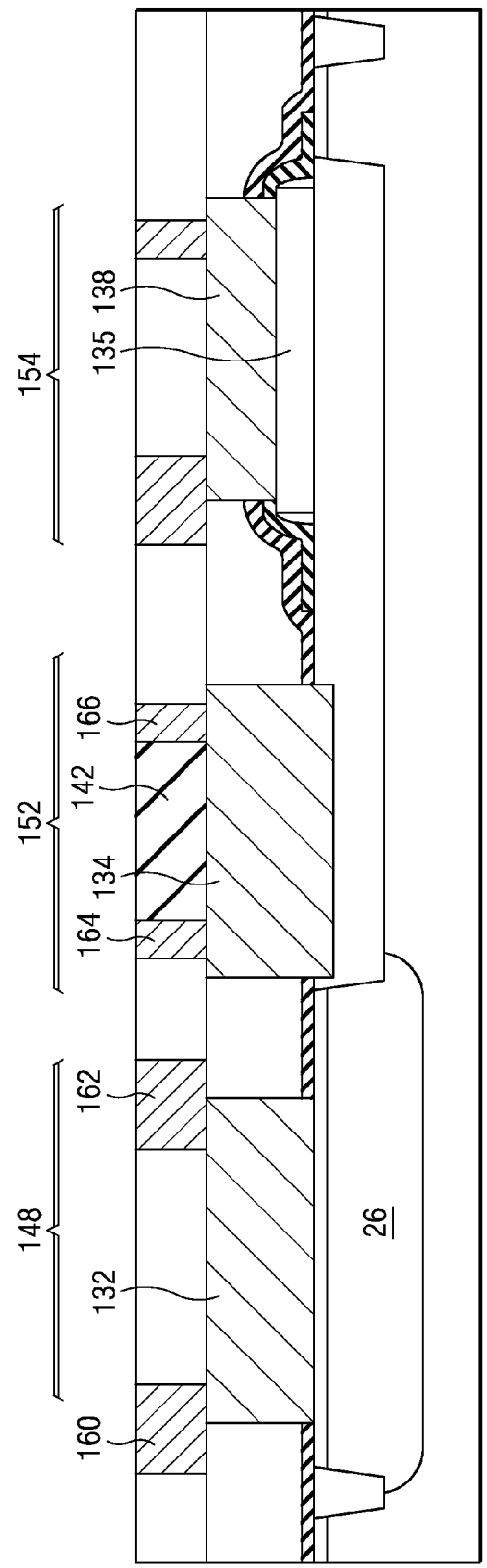
Figure 2B:
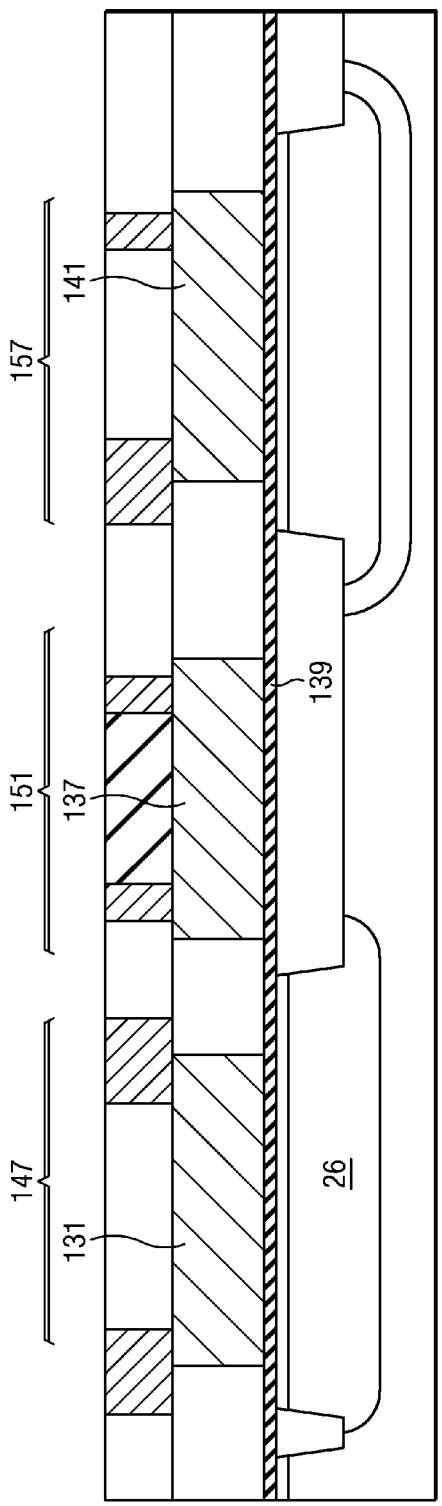

Resistors that meet the requirements for an embedded resistor temperature sensor are illustrated in FIGS. 1M-A, 1M-B, 2A, 2B and 3D. In FIGS. 2A and 2B, the resistors 147, 148, 151, 152, 157 and 158 are formed using tungsten, a material commonly used in integrated circuits for contact plugs. These resistors may be formed at the same time as the contact plugs are formed and therefore add no additional processing steps and no additional processing cost.

Figure 3A:
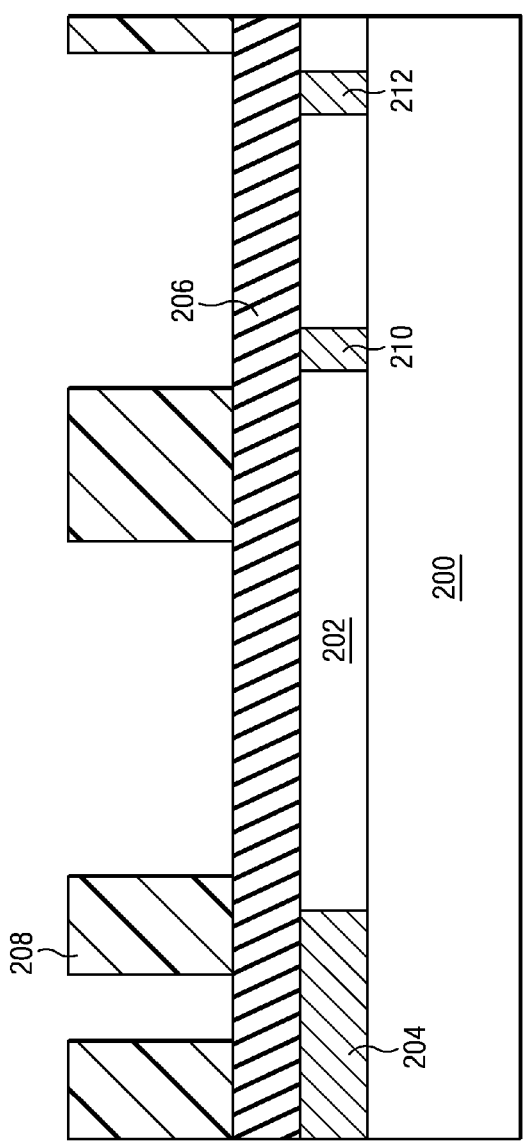
Figure 3D:
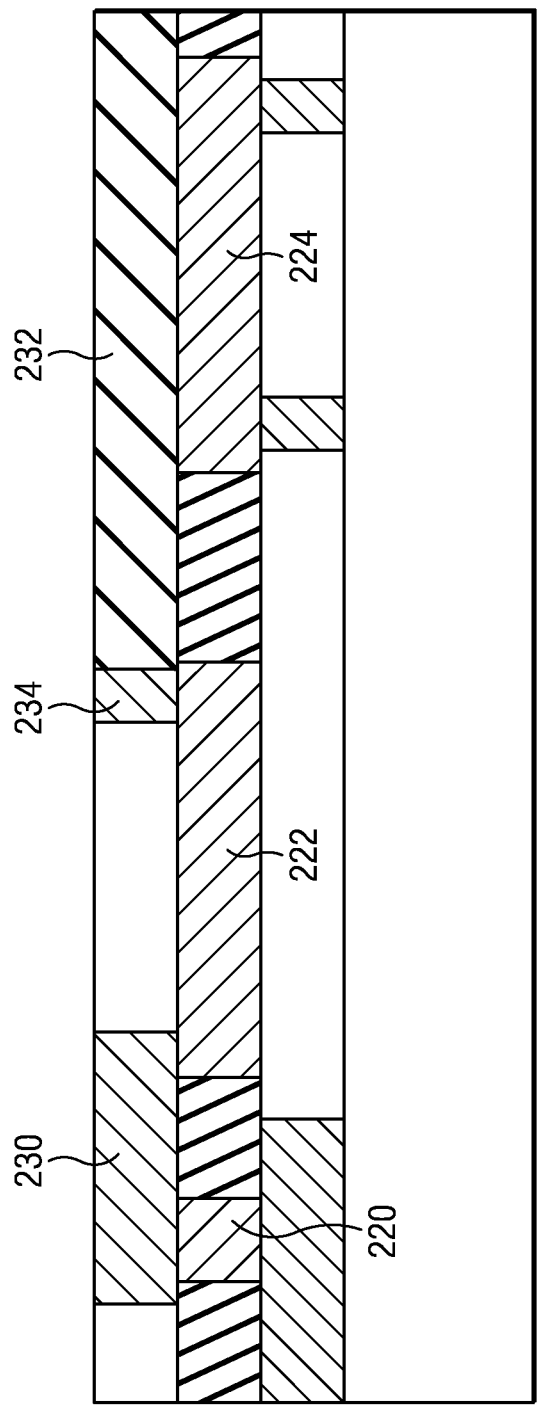

In FIG. 3D, the resistors 222 and 224 are formed using tungsten, a material commonly used for via plugs in the manufacture of integrated circuits with non damascene or single damascene interconnect. The resistors 222 and 224 are formed at the same time as via plug 220 is formed and therefore add no additional processing steps and no additional processing cost.

Tungsten resistors with a variety of resistor structures may be formed simultaneously with the formation of tungsten contact plugs. Formation of examples of these tungsten resistor structures is illustrated in FIGS. 1A through 1M-B.

In FIG. 1M-A and FIG. 2A, resistor structure 152 is formed from tungsten 136 deposited in a resistor trench over isolation dielectric 22.

In FIG. 1M-B and FIG. 2B, resistor structure 151 is formed from tungsten 138 deposited in a resistor trench between two polysilicon leads over etch stop dielectric 139. The depth of this trench is shallower than the trench for resistor 152 and therefore resistor 151 has a higher resistance per unit length and may occupy less area than resistor 152.

In resistor structure 154, (FIG. 1M-A and FIG. 2A) tungsten 138 is deposited in a resistor trench on top of an unsilicided polysilicon platform 135. The tungsten in this resistor is thinner and therefore has higher resistance per unit length than resistors 151 or 152.

Resistor structure 152 is formed in a resistor trench between two polysilicon leads over isolation dielectric 22. Sidewall dielectric prevents the tungsten 136 from shorting to the polysilicon leads. The width and therefore the resistance of resistor 152 are largely independent of the exposure of the contact photo pattern and also upon the amount of contact over etch. The depth of resistor 152 depends upon how far down into the isolation dielectric the resistor trench is etched during contact over etch.

In FIG. 1M-B and FIG. 2B, resistor structure 151 is formed in a resistor trench between two polysilicon leads over isolation dielectric 22. Sidewall dielectric prevents the tungsten 137 from shorting to the polysilicon leads. The width and therefore the resistance of resistor 151 is largely independent of the contact photo pattern exposure and also largely independent of contact over etch. The depth of resistor 151 trench is largely independent of contact over etch because of the remaining contact etch stop liner 139 at the bottom of the resistor 151 trench.

In FIG. 1M-A, resistor structure 146 is formed in a trench over nwell 26. Implants such as source and drain extension implants and source and drain implants are blocked from regions of the nwell 26 where resistor structure 146 is to be formed. Silicide 94 forms a Schottky diode to the nwell 26. When the nwell 26 is grounded, the Schottky diode is reverse biased and has a high resistance which prevents the nwell from shorting the resistor 146. Because of the high selectivity of the contact etch to silicide, forming the resistor 146 over a silicided active area 94 enables the resistor height to be substantially independent of contact over etch. This may reduce resistor variability across the wafer and lot-to-lot.

Resistor structure 148 is formed over active area to minimize resistor height variation due to contact over etch and is formed between polysilicon leads to minimize variation in width of the resistor due to contact pattern exposure and contact over etch.

Resistor structures 156 and 158 are similar to resistor structures 146 and 148 except that they are formed over an isolated p-well 34 instead of over an nwell. A resistor may be formed on a Schottky diode on n-type or on p-type semiconductor material as long as the Schottky diode may be reverse biased into high resistance preventing underlying semiconductor material from shorting the resistor.

A process for forming resistors in an integrated circuit simultaneously with forming tungsten contact plugs is described in FIGS. 1A through 1M-B. A variety of high TCR resistors are formed in the integrated circuit without adding processing steps or processing cost. It is understood that in a particular integrated circuit not all of the resistors may be formed. In a particular integrated circuit only one type of tungsten resistor may be formed or several may be formed, as desired.

FIG. 1A shows a portion of an integrated circuit that is processed through shallow trench isolation (STI). STI geometries 22 are formed in a p-type semiconductor substrate 20.

Referring now to FIG. 1B an nwell photo resist pattern 24 is formed on the integrated circuit wafer with openings through which n-type dopant 25 is implanted to form nwells 26 and 28.

In FIG. 1C, nwell photo resist pattern 24 is removed and pwell photo resist pattern 30 is formed on the surface of the integrated circuit wafer with openings through which p-type dopant 35 is implanted to form pwell 32 in the p-type substrate 20 and to form isolated pwell 34 in nwell 28. In some integrated circuit process flows, a separate pwell pattern and implantation step may not be performed. Isolated pwells may not be formed in some integrated circuit manufacturing flows.

Figure 1D:
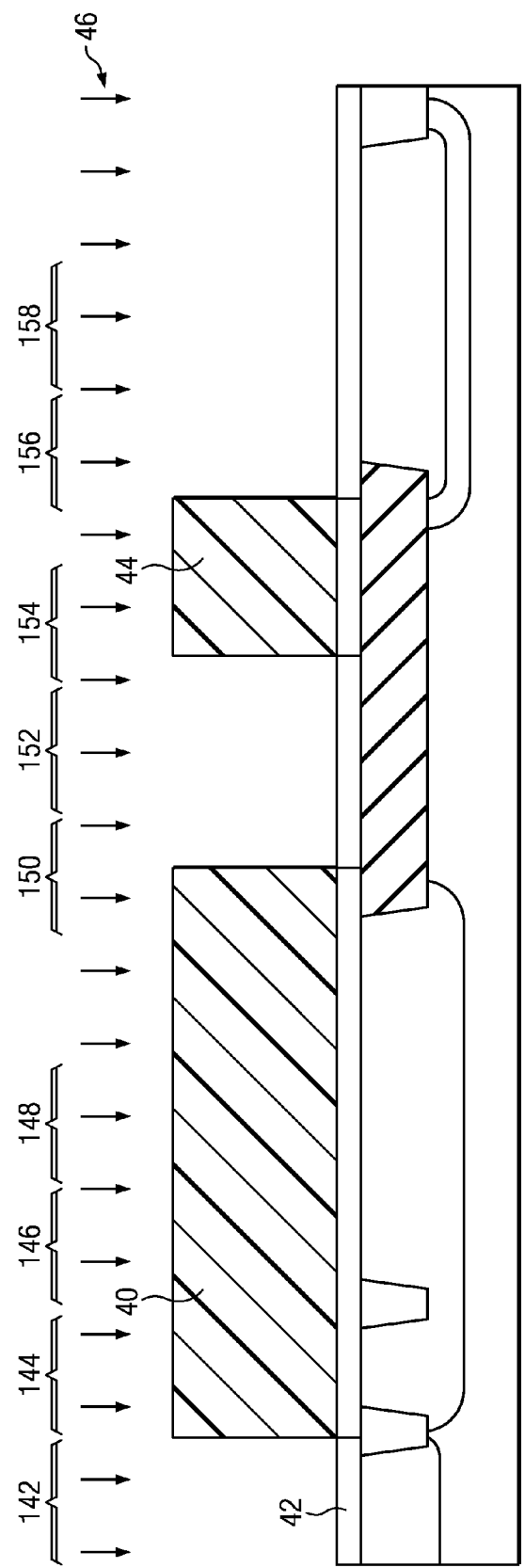

Pwell photoresist pattern 30 is removed and a transistor gate dielectric and a layer of polysilicon 42 are deposited on the integrated circuit wafer as shown in FIG. 1D. Gate doping photo resist pattern 40 is formed on the polysilicon layer 42 with openings through which an n-type dopant 46 such as phosphorus or arsenic is implanted to set the work function in the NMOS transistor regions 142. The dopant 46 is blocked from PMOS transistor areas 144 and from regions 44 where a resistor 154 is to be formed on polysilicon platform 64.

Referring now to FIG. 1E, photoresist pattern 40 is removed and a transistor gate photo resist pattern is formed on the polysilicon layer 42 with geometries 50 and 52 to defined gates in NMOS transistor area 142 and PMOS transistor area 144. Geometry 54 defines a polysilicon platform on which a resistor 154 is to be formed, and geometry 56 defines polysilicon lead pairs which may be used to define the width of resistors 148, 152, and 158 as is described below.

FIG. 1F-A shows the integrated circuit after the polysilicon 42 is etched forming NMOS gate 60, PMOS gate 62, polysilicon platform 64 on which a resistor is to be formed, and pairs of polysilicon leads 66 which may be used to define the width of resistors. Dielectric sidewalls 68 are formed on the polysilicon leads by depositing a dielectric such as silicon nitride and performing an anisotropic etch. The dielectric sidewalls on the polysilicon lead pairs 66 prevent the tungsten resistor whose width is determined by the spacing between the two polysilicon leads from shorting to the polysilicon leads.

FIG. 1F-B shows an alternate embodiment, which is identical to the embodiment of FIG. 1F-A with the exception that pairs of polysilicon leads 65 are formed in place pairs of polysilicon leads 66 of FIG. 1F-A. Pairs of polysilicon leads 65 are formed closer together than pairs of polysilicon leads 66. As described below, a contact etch stop liner deposited between the closely spaced leads 65 may form thicker contact etch stop liner in this region that is not completely removed during contact etch. The contact etch stop liner remaining between leads 65 after contact etch limits the depth of the resistor trench and forms the bottom surface of the resistor trench. Stopping the resistor trench on etch stop dielectric rather than STI dielectric improves trench depth control and also forms a resistor with reduced height and increased resistance.

Figure 1G:
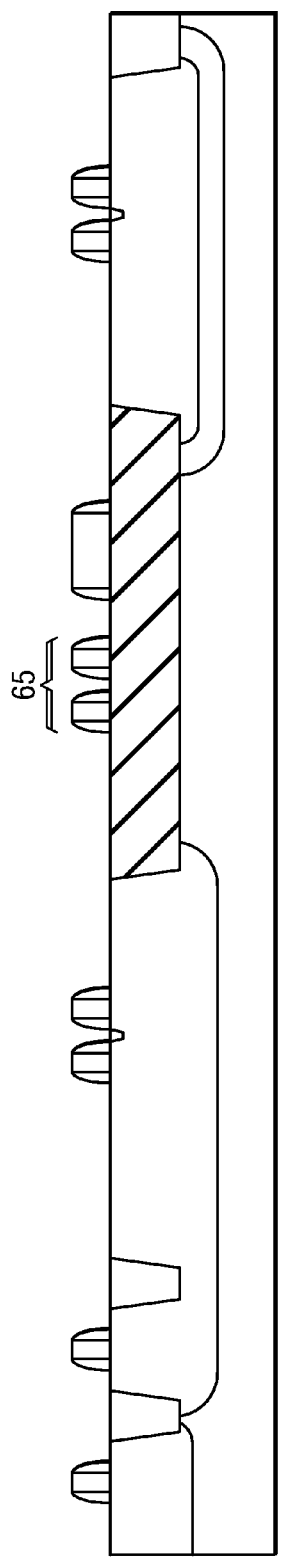
Figure 1G:
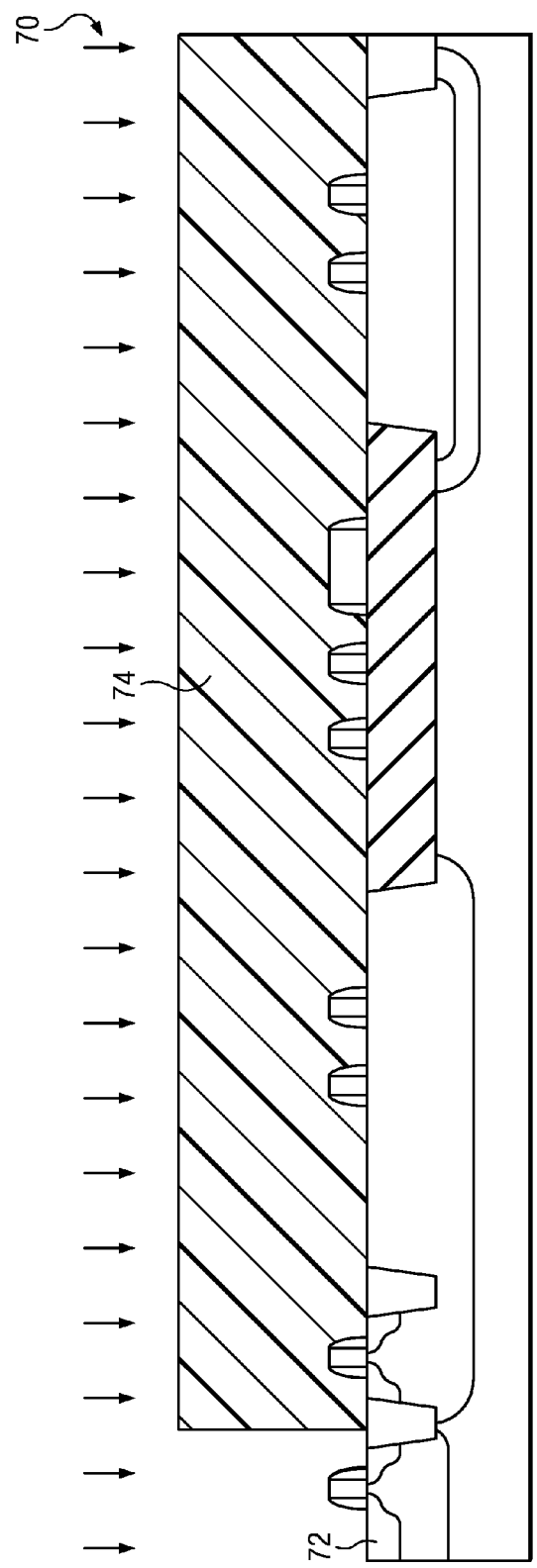

In FIG. 1G, an NSD photo resist pattern 74 is formed on the integrated circuit and n-type dopants 70 such as phosphorus and arsenic are implanted to form source and drain diffusions 72 on the NMOS transistor. The implant is blocked from PMOS transistor areas and from areas where resistors are to be formed.

In FIG. 1H, photoresist pattern 74 is removed and a PSD photo resist pattern 82 is formed on the integrated circuit and p-type dopants 84 such as boron and BF$_2$ are implanted to form source and drain diffusions 80 on the PMOS transistor. The implant is blocked from NMOS transistor areas and from areas where resistors are to be formed.

Referring now to FIG. 1I, photoresist pattern 82 is removed and a silicide block dielectric layer 90 is deposited, patterned with a silicide block photo resist pattern, and etched. Silicide block dielectric 90 is left in regions of the wafer where it is desired to block silicide formation. One such silicide blocked region is the polysilicon platform 64 on which a resistor is to be formed.

Silicide layer 96 is then formed on the gates 60 and 62, source and drains 72 and 80, of the NMOS 142 and PMOS 144 transistors, on the polysilicon pairs 66 not covered silicide block dielectric layer 90, and on the lightly doped nwell 26 and isolated pwell 34 regions forming Schottky diodes where resistors 146, 148, 156, and 158 are to be formed. Because source and drain extension dopants and source and drain dopants are blocked from the wells, 26 and 34 where the resistors are to be formed, these regions remain lightly doped.

Silicide forms a Schottky junction to these lightly doped regions. The Schottky diode may be reverse biased into a very high resistance state. Resistors 146, 148, 156, and 158 may be formed on reverse biased Schottky diodes without shorting to the underlying wells 26 and 34. Because the selectivity of contact etch to silicide is very high, the height of resistors formed on silicided active regions in wells 26 and 34 is well controlled.

Contact etch stop layers 100 and 101 and premetal dielectric (PMD) layer 108 are formed on the integrated circuit as shown in FIGS. 1J-A and 1J-B. Contact photo resist pattern 110 is formed on the PMD layer 108 with openings 102 to form contacts to the NMOS transistor, openings 104 to form contacts to the PMOS transistor, and openings 106 to form resistors.

The polysilicon leads in the polysilicon lead pairs are spaced closer together in FIG. 1J-B than in FIG. 1J-A so that the contact etch stop layer 101 forms a layer of contact etch stop liner 107 that is thicker than etch stop liner 105 in FIG. 1J-A. This thicker contact etch stop liner 107 is not completely removed during contact etch. The remaining contact etch stop layer in this region forms the bottom of the resistor trench. The spacing of the two polysilicon leads and the thickness of the contact etch stop liner may be optimized to leave the desired amount of contact etch stop liner remaining at the bottom of the resistor trench post contact etch.

As shown in the top down view of the integrated circuit of in FIG. 1K, square contact openings 112 are formed to the NMOS transistors, square contact openings 114 are formed to PMOS transistors, and rectangular trenches such as 116 and 118 are formed where resistors are to be formed. The length of the resistor trench depends upon the resistance desired. The resistor trench may have both horizontal and vertical segments to fit the required resistor length within a specific area.

The cross-section shown in FIG. 1L-A is taken along line 120 in FIG. 1K. FIG. 1L-B shows a cross-section that is identical to that in FIG. 1L-A with the exception that the resistor trench between the closer spaced polysilicon leads stops on remaining contact etch stop liner 101 whereas the resistor trench 105 shown in FIG. 1L-A between the wider spaced polysilicon leads stops on silicide layer 94.

FIG. 1M-A shows the integrated circuit after the contact holes 112 and 114 and the resistor trenches are filled with CVD tungsten. Filling the resistor trenches with CVD tungsten forms tungsten resistors 146, 148, 150, 152, 154, 156, and 158. In an example embodiment, after the contact holes and resistor trenches have been etched a thin barrier layer of TiN is deposited prior to filling the contacts and resistor trenches with CVD-W. CMP is then used to planarize the contact plugs and the resistors.

Intermetal dielectric layer 142 and first layer interconnect 144 are then formed on the integrated circuit. The interconnect 144 may be a metal such as aluminum alloy which is deposited and etched or may be a metal such as copper which is formed in dielectric trenches etched using a damascene process.

FIG. 1M-B is identical to FIG. 1M-A with the exception that resistors 147, 151, and 157 are formed on contact etch stop liner which remains between the closely space polysilicon leads after contact and resistor trench etch. The control of the height of resistor 151 in FIG. 1M-B is better than control of the height of resistor 152 in FIG. 1M-A. The height of resistor 152 in FIG. 1M-A is dependent upon how deeply the resistor trench etches into STI dielectric during contact over etch whereas the height of resistor 151 in FIG. 1M-B is independent of contact over etch because it stops on remaining contact etch stop liner.

FIG. 2A illustrates how resistors 148, 152 and 158 of FIG. 1M-A may look when cross sectioned through the resistors lengthwise. Resistor 148 is formed on the silicided region of nwell 26. Contact etch has a high selectivity to active so the height of the resistor may be very well controlled across wafer and lot-to-lot. Interconnect geometries 160 and 162 form electrical contact to the heads of the resistor 148.

Resistor 152 is formed over isolation dielectric 22. Because of low selectivity of STI dielectric to contact etch, the height of resistor 152 depends upon how deep the resistor 152 trench penetrates into the STI dielectric 22 during contact over etch. The height and therefore resistance of the resistor 152 depends upon contact etch. First layer of interconnect geometries 164 and 166 form electrical contact to the heads of resistor 152. The interconnect geometries may overlap the resistor heads as on resistor 148 or may under lap the resistor heads as on resistor 152.

Resistor 154 is formed on a polysilicon platform 135. Silicide is blocked from forming on polysilicon platform 135. The polysilicon is high resistance. The depth of the resistor 154 trench is well controlled since the selectivity of polysilicon to the contact etch is very high. Because the height of the resistor 154 formed on the polysilicon platform 135 is significantly less than the height of the resistor 148 formed over nwell 26 and significantly less than the height of resistor 152 formed over STI dielectric 22, the resistance per unit length of resistor 154 is significantly higher than that of resistors 148 and 152. Because the resistance of resistor 154 is higher than that of resistors 148 and 152, a resistor 154 with equivalent resistance to resistors 148 and 152 may be formed in smaller area.

FIG. 2B illustrates resistors 147, 151 and 157 of FIG. 1M-B when cross sectioned lengthwise. Because these resistors are formed over closely spaced polysilicon leads where a thicker layer of contact etch stop liner may form, the bottom of these resistors is formed on contact etch stop liner that remains after the contact and resistor trench etch. Because resistors 147 and 157 are formed on dielectric, there is no requirement for a reverse biased Shottky diode to be formed beneath the resistors 147 and 157 which are formed over active regions in nwell 26 or pwell 34. Because resistor 151 is formed over contact etch stop liner 139 rather than STI dielectric, the height of resistor 151 is independent of contact over etch.

Resistors formed simultaneously with the formation of tungsten via plugs are illustrated in FIGS. 3A through 3D. Resistor structures 222 and 224 (FIG. 3D) are formed in trenches in the ILD dielectric 206 which are etched simultaneously with via 220 (FIG. 3D).

As shown in FIG. 3A, an intermetal dielectric layer (IMD) 202 with interconnect geometries 204, 210, and 212 is formed on an integrated circuit 200. Interconnect geometries 204, 210, and 212 may be formed with a first layer of interconnect or may be formed with a higher level of interconnect. Integrated circuit 200 may have one or more levels of interconnect.

ILD layer 206 is formed on the integrated circuit over IMD layer 202 and over interconnect geometries 204, 210, and 212. A via photo resist pattern 208 is formed on the integrated circuit with openings to etch via 214 (FIG. 3B) and with openings to etch trenches, 216 and 218 (FIG. 3B) in which resistors are to be formed.

As shown in FIG. 3B, resistor trench 218 is formed over interconnect leads 210 and 212 which are spaced apart to form electrical contact to the heads of the resistor 224.

FIG. 3C shows the integrated circuit after the via opening 214 and resistor trenches 216 and 218 are filled with tungsten and planarized to form via plug 220 and resistors 222 and 224. Underlying interconnect geometries 210 and 212 form electrical contact to the bottom side of the heads of resistor 224.

FIG. 3D shows the integrated circuit after intermetal dielectric layer 232 is deposited and interconnect geometries 230 and 234 are formed. Interconnect geometries 230 and 234 form top side electrical contact to the heads of resistor 222.

One or both types of resistors 222 and 224 may be formed in a production integrated circuit. In addition a resistor with one resistor head contacted from above and the other resistor head contacted from below may be formed. The high TCR resistors described above are formed simultaneously with via plugs and without adding additional process steps or additional cost to the integrated circuit manufacturing flow.

Those skilled in the art to which this invention relates will appreciate that many other embodiments and variations are possible within the scope of the claimed invention.

What is claimed is:

1. An integrated circuit, comprising:
   a well;
   a silicide active geometry in said well where said silicide active geometry forms a Schottky diode to said well;
   a tungsten resistor formed on said silicide active geometry;
   two parallel polysilicon leads whose length is equal to or greater than a body of said tungsten resistor; and
   sidewall dielectric on vertical sidewalls of said parallel polysilicon leads;
   where said body of said tungsten resistor lies between said parallel polysilicon leads, where a width of said tungsten resistor is defined by a spacing between said parallel polysilicon leads and where said sidewall dielectric prevents said tungsten resistor from shorting to said parallel polysilicon leads.

2. The integrated circuit of claim 1 where said well is an nwell and where said silicide is titanium silicide, cobalt silicide, or nickel silicide.

3. The integrated circuit of claim 1 where said well is an isolated pwell and where said silicide is titanium silicide, cobalt silicide, or nickel silicide.

4. The integrated circuit of claim 1, wherein said Schottky diode is reversed biased.

5. The integrated circuit of claim 1, further comprising:
   a contact etch stop liner on a surface of said integrated circuit and between said two parallel polysilicon leads to form a bottom of a resistor trench;
   where the two parallel polysilicon leads are on a surface of said integrated circuit.

6. The integrated circuit of claim 1, further comprising:
   a polysilicon platform of a surface of said integrated circuit where silicide is blocked from forming on said polysilicon platform; and
   a second tungsten resistor formed on said polysilicon platform.

7. The integrated circuit of claim 6 where said polysilicon platform is formed on a dielectric.

8. An integrated circuit, comprising:
   a semiconductor wafer containing said integrated circuit processed through at least on level of interconnect;
   a first dielectric layer;
   a lower interconnect geometry formed in said first dielectric layer;
   a second dielectric layer formed on said first dielectric layer and on said lower interconnect geometry;
   a tungsten via plug formed in said second dielectric layer in contact with said lower interconnect geometry;
   a tungsten resistor formed over said first dielectric layer and formed in said second dielectric layer;
   a third dielectric layer formed on said second dielectric layer and on said tungsten via plug and on said tungsten resistor;
   a first upper interconnect geometry formed over and in contact with said via plug;
   a second interconnect geometry in contact with a first head of said tungsten resistor; and
   a third interconnect geometry in contact with a second head of said tungsten resistor.

9. The integrated circuit of claim 8 where said second interconnect geometry and said third interconnect geometry are lower interconnect geometries and contact said first and said second heads of said tungsten resistor from below.

10. The integrated circuit of claim 8 where said second interconnect geometry and said third interconnect geometry are upper interconnect geometries and contact said first and said second heads of said tungsten resistor from above.

* * * * *